United States Patent [19]

Rios

[11] Patent Number: 4,744,768
[45] Date of Patent: May 17, 1988

[54] COUPLING CONNECTOR

[75] Inventor: Juan P. Rios, Phoenix, Ariz.

[73] Assignee: Minnesota Mining and Manufacturing Company, St. Paul, Minn.

[21] Appl. No.: 12,849

[22] Filed: Feb. 10, 1987

[51] Int. Cl.⁴ ......................................... H01R 13/629
[52] U.S. Cl. ................................... 439/262; 439/264; 439/265; 439/269
[58] Field of Search ............... 439/259, 262, 263, 264, 439/265, 266, 267, 268, 269, 270

[56] References Cited

U.S. PATENT DOCUMENTS

| | | | |
|---|---|---|---|
| 3,315,212 | 4/1967 | Peterson | 439/264 |
| 3,569,905 | 3/1971 | Kehagioglou | 339/75 |
| 3,763,459 | 10/1973 | Millis | 339/75 M |
| 3,865,457 | 2/1975 | Carter | 339/74 R |
| 4,012,099 | 3/1977 | Worcester | 439/264 |
| 4,077,688 | 3/1978 | Cobaugh et al. | 339/74 R |
| 4,314,736 | 2/1982 | Demnianiuk | 339/74 R |
| 4,341,429 | 7/1982 | Bright et al. | 439/268 |
| 4,343,524 | 8/1982 | Bright et al. | 439/268 |
| 4,377,319 | 3/1983 | MacDougall | 339/75 M |
| 4,381,130 | 4/1983 | Sprenkle | 439/268 |
| 4,402,563 | 9/1983 | Sinclair | 339/75 M |
| 4,422,703 | 12/1983 | Christensen et al. | 339/74 R |
| 4,468,072 | 8/1984 | Sadigh-Behzadi | 339/74 R |
| 4,534,606 | 8/1985 | Olsson | 339/75 M |
| 4,538,866 | 9/1985 | Johnson | 339/17 LM |
| 4,540,229 | 9/1985 | Madden | 339/75 M |
| 4,588,244 | 5/1986 | Anhalt et al. | 339/75 M |

Primary Examiner—John McQuade
Attorney, Agent, or Firm—Donald M. Sell; James A. Smith; John C. Barnes

[57] ABSTRACT

A connector with a base having a plurality of contacts that are operable and which can be closed, with opposing sides resiliently forced against device terminals which force can be supplemented by further force provided by an actuator.

30 Claims, 7 Drawing Sheets

COUPLING CONNECTOR

BACKGROUND OF THE INVENTION

1. Field of the Invention.

The present invention relates to electrical coupling connectors for connecting and disconnecting devices to and from other circuits and, more particularly, to connectors wherein the force required to insert such devices can be controlled.

The density of electronic circuits which can be provided in a single housing arrangement is increasing markedly. Monolithic integrated circuit chips, in particular, are experiencing increases in the density of circuits contained therein. As a result, the housings for such electronic components must provide an ever increasing number of terminals for making electrical connections to the electronic devices contained therein or thereon. That is, the increases in circuit densities in a housing leads to the need for greater numbers of input terminals, output terminals, power supply terminals and the like. Since the housings themselves are designed to also be as small as possible for achieving high circuit densities, these terminals for the housing are becoming smaller in cross section, and so more delicate, and are also being positioned closer to one another.

Such electronic devices must, at the very least, be tested before use. Often, there is also a desire to evaluate the performance of the system they are to be used in and, in doing so, there will be a desire to substitute various of such electronic devices into the circuits to thereby check system performance. These, and other kinds of uses, lead to a need for connectors which will electrically couple such electronic devices at the terminals thereof to other devices having electronic circuits in them, such as test circuit arrangements, system prototype circuits and the like. However, the increasingly delicate housing terminals provided on these electronic devices cannot withstand high stresses in inserting them into the connector, or even repeated moderate stresses resulting from such insertions. Nevertheless, a certain amount of stress is required because the contacts in the coupling connector must be solidly against the housing terminals if satisfactory electrical interconnections are to be made.

As a result, the use of so-called low insertion force and zero insertion force connectors has come about. Low insertion force usually means there will be contact means in the connectors which lead to some frictional force in inserting the device terminals therein. As the numbers of device or housing terminals increase, these individual pin-connector forces, though small individually, accumulate to the point that the total force required to insert the device becomes quite high, often unacceptably high.

Because of such results, zero insertion force connectors are commonly used, with the contacts in the connector either being (i) normally closed but openable, or (ii) normally open but closable. In the first instance, the contacts usually are of two sides made of an elastic, conductive material so that they are resiliently held against one another. This resilient force, then, is the only force which is applied against the device terminals, a force which may be inadequate to assure good electrical contact.

The alternative of normally open contacts also usually has a two sided contact of an elastic, conductive material which uses the resilient force available in the material to keep the two sides apart. Thus, the actuation mechanism for the connector must not only provide sufficient force to hold the device terminals but also sufficient force to overcome the resilient force of all of the contacts. Providing a force certain to overcome the resilient force of all the contacts can easily lead to too much force being applied against the device terminals. All this force is applied not only against the contacts but also against the plastic connector bodies which have a tendency to creep in these circumstances, especially if used at higher temperatures such as in device testing at such temperatures or in extended operation at such temperatures for purposes of finding early device failures (burn-in). Furthermore, force tends to limit the life of the connector because in these circumstances operation of the cam leads to wearing out the connector parts. Thus, a connector capable of avoiding these difficulties is desired.

SUMMARY OF THE INVENTION

The present invention provides a connector with a base having a plurality of contacts each of an elastic, conductive material and having multiple sides which are forced against one another by the resilient force of the material. A contact operation body can move one side of the contacts away from an opposite side to permit the connector to accept device terminal insertions, and can also permit these contact opposite sides to come together so that the resilient force of the contacts forces the two sides against the device terminals. An actuation means, which separates the opposing contact sides and releases them to permit their forcing themselves through the resilient force against the device terminals, can supplement this force by further forcing the contact sides against the terminals.

DETAILED DESCRIPTION OF THE PREFERRED EMBODIMENTS

Figure 1A:
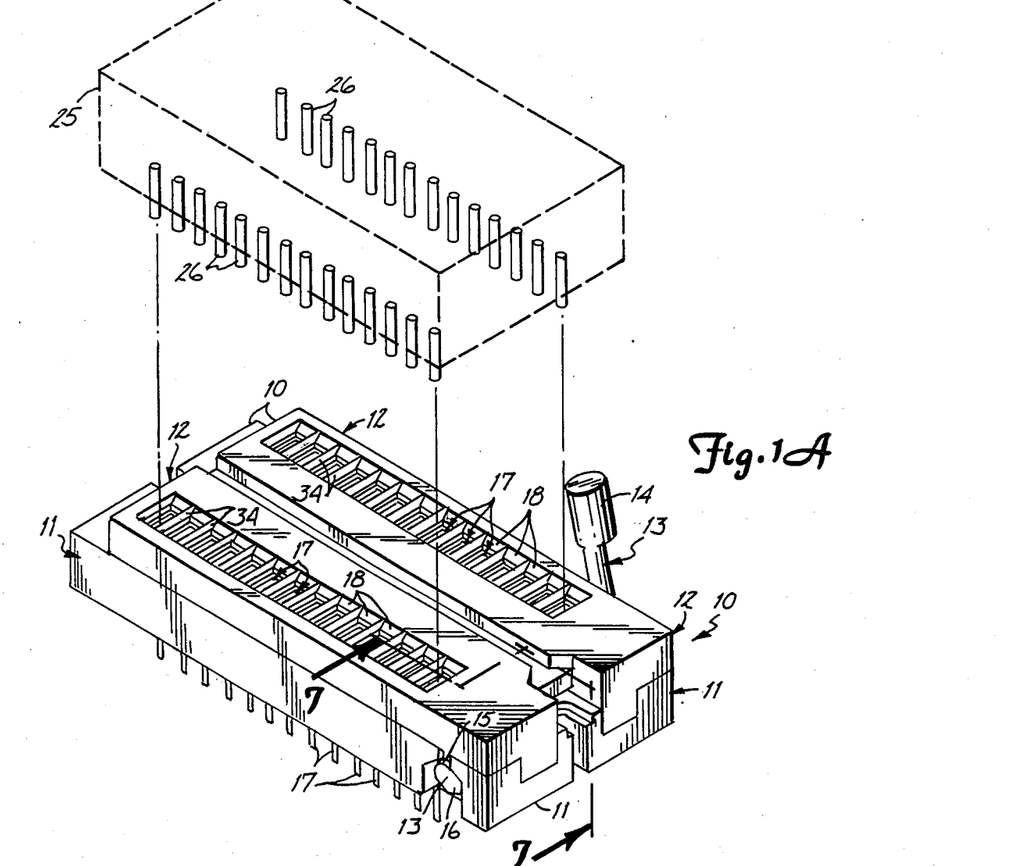
FIG. 1A shows the coupling connector of the present invention.

FIG. 1A shows a coupling connector, 10, forming the present invention. Connector 10 has three major parts therein in addition to a set of normally closed contacts. The first of these parts is a base, 11, over which is provided a contact operator, 12.

A cam actuator, 13, is positioned between them, in recesses formed in each, to provide a means for moving contact operator 12 with respect to base 11. Cam actuator 13 has a handle portion, 14, which is at, or nearly at, a right angle to the main rotatable shaft, 15, of cam actuator 13 at the end of which is formed a cam actuator stop, 16.

Finally, a plurality of normally closed contacts, 17, are each positioned in base 11 with a lower interconnection portion of each contact 17 extending therethrough, as can be seen below base 11 in FIG. 1A. The upper portion of each contact 17 extends above base member 11 into a corresponding plurality of terminal reception openings, 18, formed in contact operator 12.

Figure 1B:
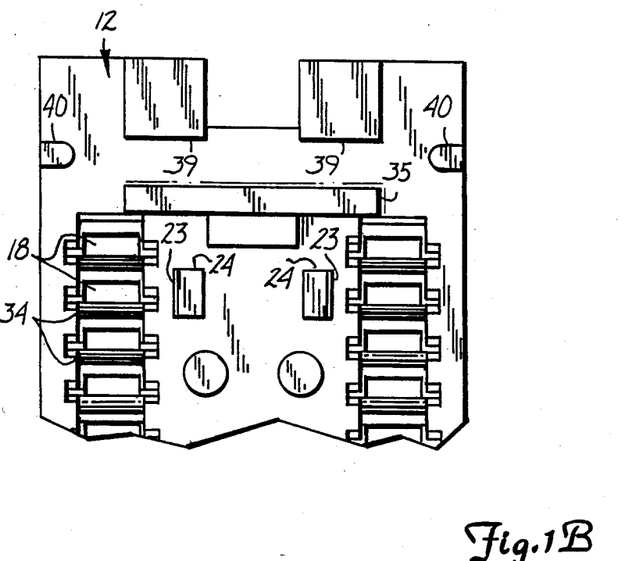
FIGS. 1B and 1C each show a portion of the structure of FIG. 1A.
Figure 1C:
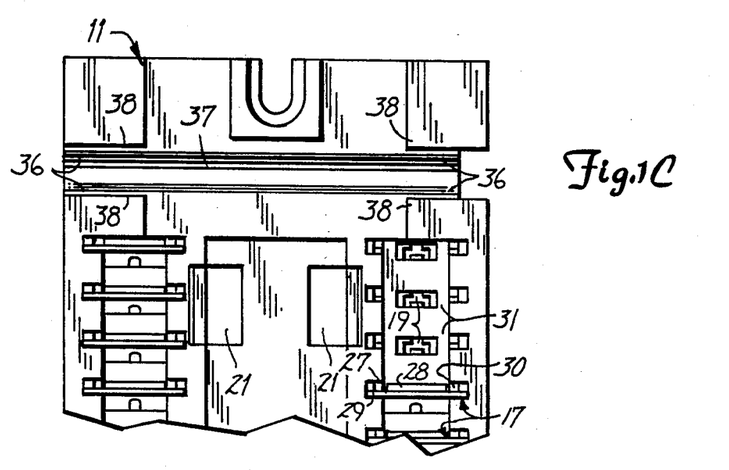

FIG. 1B shows the under side of contact operator 12 while FIG. 1C shows the top side of base 11. The surfaces of contact operator 12 and base 11 shown in these figures are adjacent to, or against, one another in FIG. 1A. Some of contacts 17 have been removed in the lower row thereof in FIG. 1C to clarify the structure of base 11.

Figure 2:
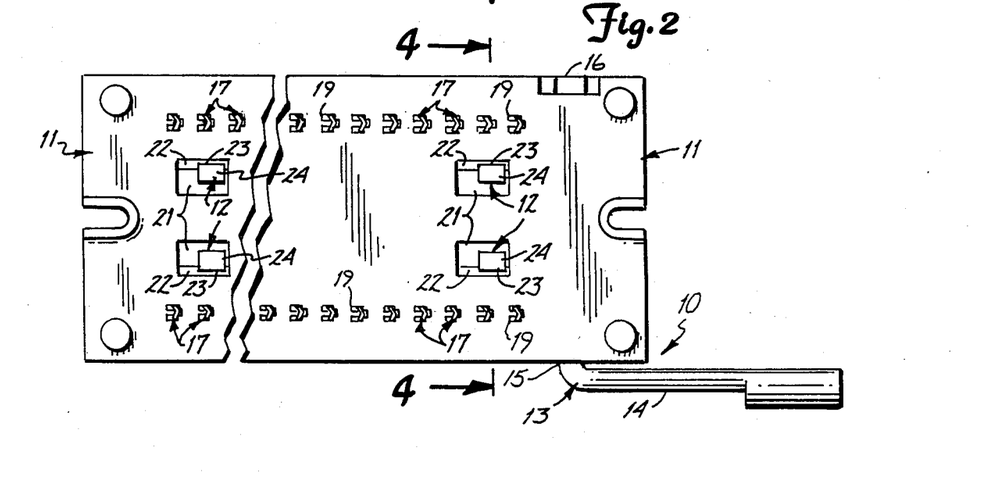
FIG. 2 shows an underside view of the structure of FIG. 1A.

FIG. 2 shows a bottom view of connector 10 which is broken to permit this view to conveniently fit on the drawing. The bottom of base 11 is clearly seen to have openings, 19, in this base 11 lower surface due to passageways extending through base 11 into recesses used to accommodate each of contacts 17. Openings 19 can each be seen to have a lower portion of a contact 17 extending therethrough to permit interconnection to other circuit means. Openings 19 are constructed to have a slight protrusion of base 11 extending into the opening area to firmly hold contact 17 lower portion in place.

Figure 3:
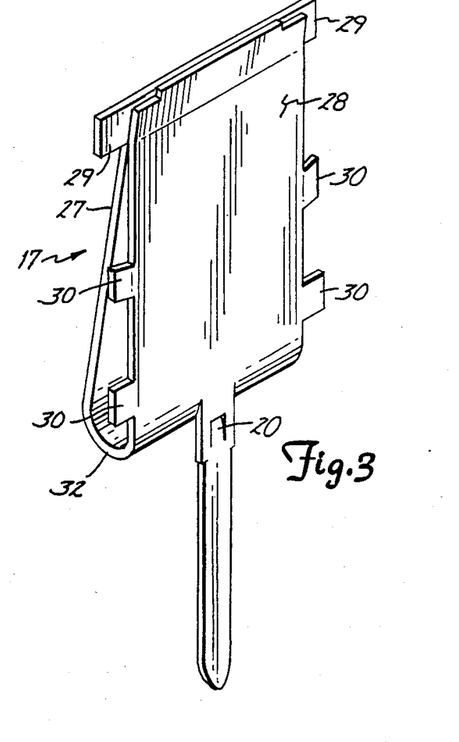
FIG. 3 shows a part which fits into the structure of FIG. 1A.

As can be seen from FIG. 3, the lower portion of contact 17 has a three-sided cut to allow a tab, 20, to be pressed out of the plane of the lower portion of contact 17. Tab 20 provides a resilient spring surface which goes against the protrusion portion of base 11 in opening 19 to hold contact 17 in place during assembly and to limit vertical displacement of contact 17.

FIG. 2 also shows four elongated engagement openings, 21, each of which extends through base 11. Each of these openings has a shoulder, 22, protruding therein to capture lips, 23, formed on engagement protrusions, 24, extending from contact operator 12. This capture can be more clearly seen in FIG. 4, which is a cross section view of FIG. 2 extending through engagement openings 21. Engagement protrusions 24, so captured, keep the lower surface of contact operator 12, shown in FIG. 1B, against the upper surface of base 11, shown in FIG. 1C.

Nevertheless, because of the elongation of openings 21, engagement protrusions 24 can move from one end toward the other of opening 21 as contact operator 12 moves with respect to base 11. Therefore, even though contact operator 12 moves with respect to base 11, the two remain against one another held there by engagement protrusions 24 having lips 23 thereof extending under shoulders 22 protruding into openings 21. Engagement protrusions 24 are somewhat resilient to permit the assembly of contact operator 12 to base 11 by having lips 23 ride over shoulders 22 in assembling them together.

The materials for base 11 and contact operator 12 must provide both this resiliency and a high electrical resistance so that there is no electrical current leakage between contacts 17 even though there are voltage differences occurring between them. Furthermore, these materials should maintain their shapes and strength at the elevated temperatures encountered in the testing of electrical and electronic devices and in "burn-in" efforts. Suitable materials for this purpose have been found to be glass fiber filled polyetherimide or polyethersulfone. The glass fiber fill is typically thirty percent (30%) by weight.

Figure 4:
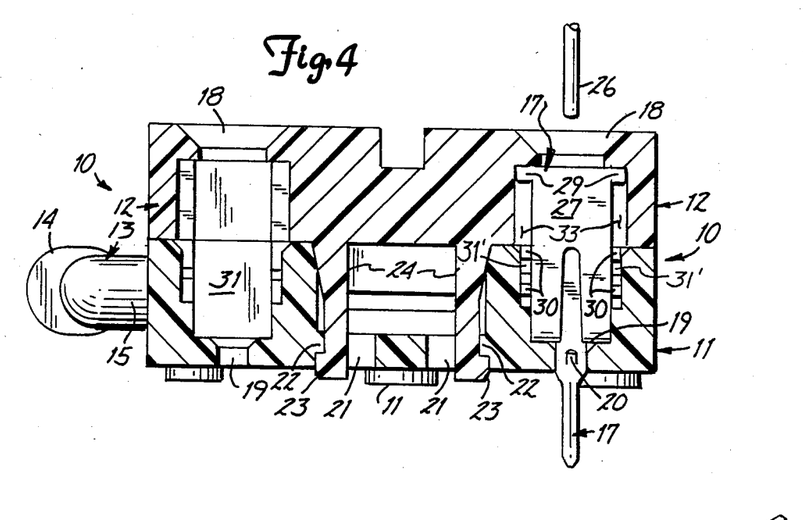
FIG. 4 shows a cross section view of FIG. 2.

Returning to FIG. 1, there has been shown there a representative housed electronic device, 25, having terminals, 26, extending therefrom for insertion into connector 10. Such a device might typically be an integrated circuit package which connector 10 is to couple to the circuit means interconnected to the lower portions of contact 17. FIG. 4 shows one of terminals 26 poised for insertion into connector 10 through one of the terminal reception openings 18 shown and then between the opposing sides of a contact 17.

The opposing sides, 27 and 28, of contact 17 can be more clearly seen in FIG. 3. Side 27 has a pair of projections, 29, near its top extending past side 28 to a width greater than that of side 28 at a corresponding location across from side 27. Side 28, on the other hand, has two pairs of projections, 30, extending past side 27 to a width greater than that of side 27 at corresponding locations, these pairs of projections being located in the middle of side 28 and toward the bottom of side 28. Protrusions 29 are impelled by contact operator 12 to move sides 27 and 28 apart in beginning an interconnecting operation of device 25. With a contact 17 in a base contact recess, 31, in base 11, protrusions 30 interfere with sides of base 11 in slots, 31′, which open to contact recesses 31. Such interference by protrusions 30 anchors each side 28 of each contact 17 to base 11 in its corresponding contact recess 31 to prevent later movement. Again, tab 20 limits vertical displacement, and a further limit is provided by contact operator 12. One of contacts 17 can be seen in FIG. 4, and the relative positions of protrusions 29 and 30 are shown there.

Opposing sides 27 and 28 of contact 17 in FIG. 3 are shown against one another at the top. This normally closed contact situation occurs because of the resilient force residing in the structure of sides 27 and 28 and in the portion, 32, of contact 17 joining opposing sides 27 and 28 together both mechanically and electrically. That is, contacts 17 are stamped from a metal which provides sufficient resiliency so that the subsequent formation of opposing sides 27 and 28 after the stamping can lead to there being a resilient force directing them against one another.

Figure 5:
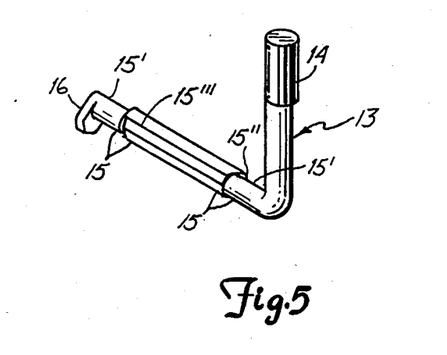
FIG. 5 shows a part which fits into the structure of FIG. 1A.

FIG. 5 shows a perspective view of cam actuator 13. Handle 14 and stop 16 are both shown at approximately right angles with rotatable shaft 15. As can be seen along shaft 15, there are two portions, 15′, which are symmetrical about the shaft rotational axis. Between them occur the cam surfaces of cam actuator 13. A first protrusion portion, 15″, is further away from the shaft axis of rotation than are other portions of cam actuator 13 lying along the same part of shaft 15. A second portion, 15''', is also further away from the axis of rotation than most other portions of shaft 15 in the same region but not so far away as protrusion 15''. In practice, these two protrusions may be separated or blended together, as shown. Protrusions 15'' and 15''' provide the actuating surfaces for moving contact operator 12 with respect to base 11.

Figure 6:
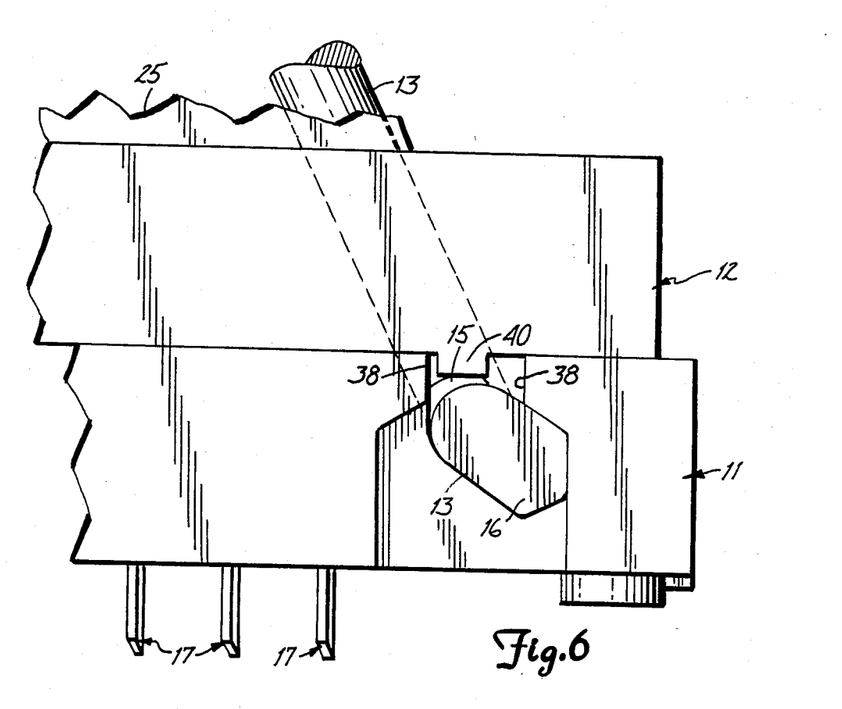
FIG. 6 shows another view of a portion of the connector of FIG. 1A.
Figure 7:
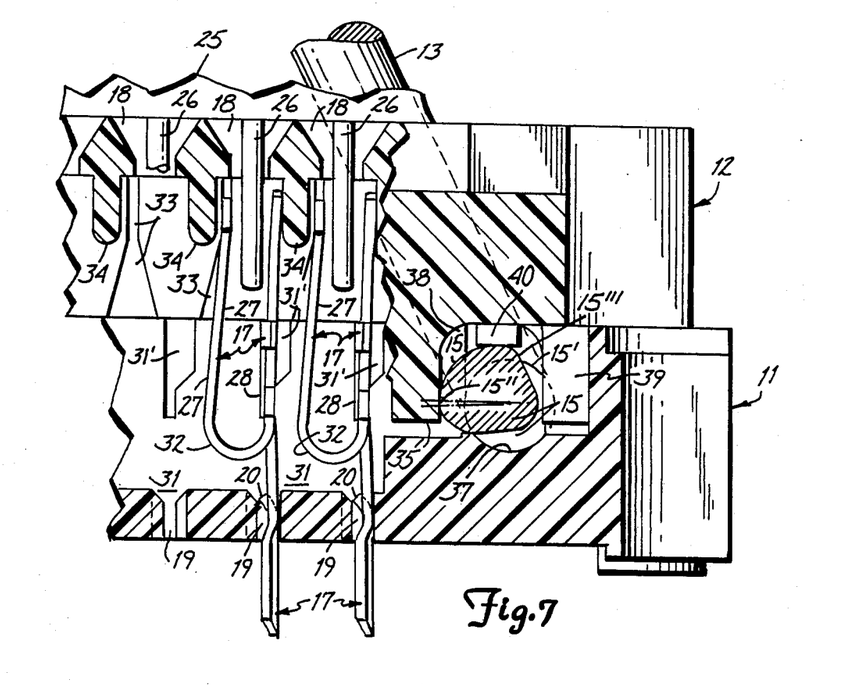
FIG. 7 shows a cross section view of a portion of the connector of FIG. 1A which is approximately that portion shown in FIG. 6.

In operation, cam actuator 13, by sufficient force being applied by handle 14, can move contact operator 12 with respect to base 11 to separate opposing sides 27 and 28 of each of contacts 17. The results of this operation are shown in FIGS. 6 and 7, FIG. 7 being a broken cross section view of FIG. 1. FIG. 6 shows cam actuator 13 in its farthest counterclockwise position in that view. This counterclockwise position is established by cam actuator stop 16 being stopped against a portion of base 11, as shown in FIG. 6. In this position, contact operator 12 is moved to its farthest left position with respect to base 11. In the breakaway cross section view of FIG. 7, the results of moving cam actuator 13 to this position can be seen.

A portion of device 25 is shown against the upper surface of contact operator 12 having device terminals 26 thereof extend through terminal reception openings 18 in contact operator 12. Protrusions 29 fit into slots, 33, on either side of opening 18 in contact operator 12 with each side of each slot 33 forming an impelling portion to impel protrusions 29 in whichever direction, right or left, contact operator 12 moves. Protrusions 30 fit into the slots 31' which open into base contact recesses 31. Some of contacts 17 have been omitted in FIG. 7 to make this clearer to see.

Note that each of base contact recesses 31 open to adjacent base contact recesses to thereby form an open channel, though separated recesses could be used. Nevertheless, each base contact recess has an individual passageway opening 19 in the lower surface of base 11. On the other hand, terminal reception openings 18 are each separated by a cross member, 34.

Contact operator 12 is forced to move to the left with respect to base 11 by the large protrusion 15'' on rotatable double shaft 15 being turned against an actuation protrusion, 35, formed as part of contact operator 12. Actuation protrusion 35 can move, in effect, into and out of an opening in the side wall of a base recess, 36, formed by a semicircular recess portion, 37, and by those extended recess wall portions, 38, on the left, as shown in FIG. 1C. As large protrusion 15'' pushes against actuator protrusion 35 to move it out from recess 36, shaft portions 15' push against circular recess portion 37 and the right-hand wall portions 38.

This oppositely directed pushing moves contact operator 12 to the left with respect to base 11, which in turn moves protrusions 29 of side 27 of each of contacts 17 to the left also. However, side 28 of each of contacts 17, being anchored in base 11, do not move significantly with the result that opposing sides 27 and 28 of each contact are separated sufficiently to permit easy insertion of device terminals 26 therebetween.

Protrusion 15'' can turn slightly past the point of its maximum extent to the left before stop 16 is blocked by base 11. As a result, the reverse push on shaft 15 due to the resilient force of contacts 17 holds cam actuator 13 in the position shown in FIGS. 6 and 7 until a sufficient clockwise force is applied to handle 14 to rotate cam protrusion 15'' back past actuator protrusion 35. Once this occurs, the resilient force in each of contacts 17 cause contact operator 12 to move to the right until opposing sides 27 and 28 of each of contacts 17 close on the corresponding terminal 26, the result being shown in FIGS. 8 and 9.

Figure 8:
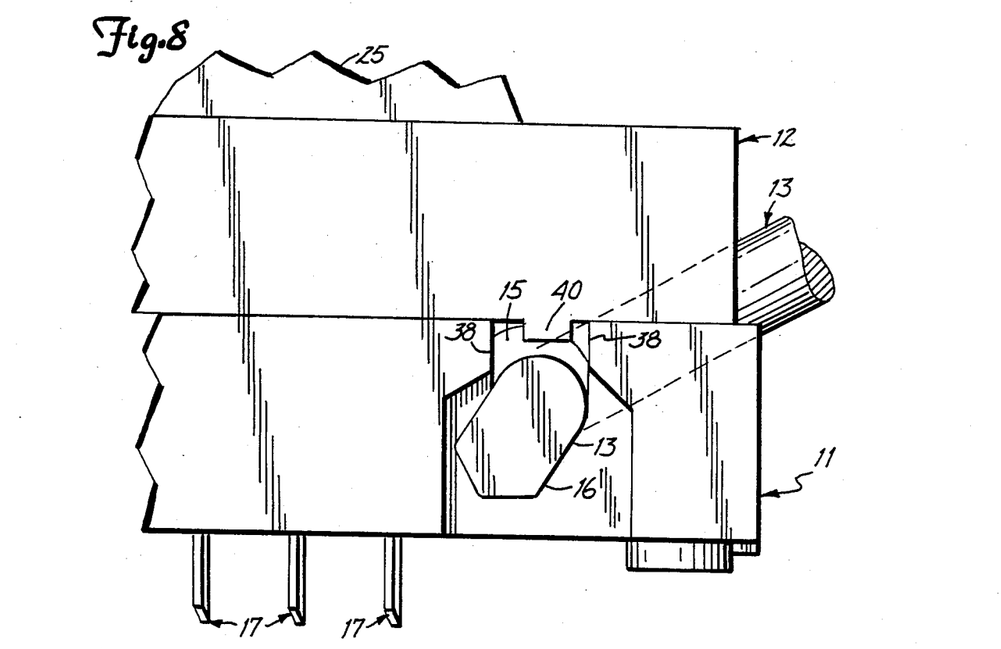
FIG. 8 shows the same connector portion as FIG. 6 but in a different state.
Figure 9:
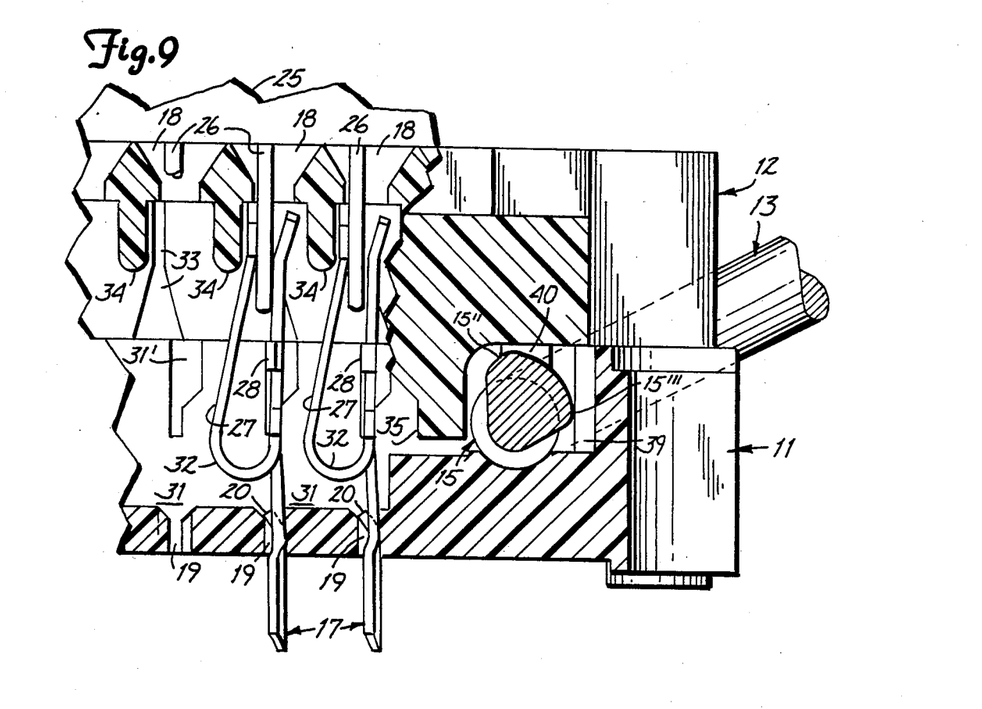
FIG. 9 shows a cross section view of the connector of FIG. 1A at the location of the cross section view in FIG. 7 but for the state shown in FIG. 8.

FIG. 9 is a cross sectional view of connector 10 located in about the same place that the cross section view shown in FIG. 7 was located in connector 10 in FIG. 1A. This time, however, cam shaft actuator 13 is not shown in the position it was in in connection with FIGS. 1A and 7 but is shown as last described after opposing sides 27 and 28 of each of contacts 17 have closed on terminals 26. Cam actuator 13 is thus at a position determined by (i) the diameters of terminals 26 in permitting contact operator 12 to move to the right, and (ii) whatever force is due to the cantilevered weight of cam shaft 13 turning shaft 15 against a further set of actuation protrusions, 39, formed as part of contact operator 12. Cam actuator stop 16 is free to rotate in this situation as it is not blocked in so rotating by any portion of base 11 as shown in FIG. 8.

Thus, opposing sides 27 and 28 of each of contacts 17 are forced against the corresponding terminal 26 only by the resilient forces urging these sides together. As indicated above, this provides a substantial measure of force against each of terminals 26, and without any significant force of reaction being exerted against either contact operator 12 or base 11. Thus, these forces against terminals 26 do not in any way act to cause creeping of the materials in contact operator 12 or base 11.

On the other hand, there has often been found to be an insufficient amount of force against the terminals of a test device where the force is no more than that due to the resilient forces contained in the opposing sides of contacts about such terminals. As a result, connector 10 has an addition of a further increment of force directed toward having opposing sides 27 and 28 of each of contacts 17 forced together to an even greater degree while squeezing the corresponding terminal 26 therebetween. This is accomplished by permitting cam actuator 13 to turn to a further clockwise position to result in cam portion 15''' pressing more strongly against the set of actuator portions 39 to move contact operator 12 further to the right.

Actuation protrusion set 39 can move, in effect, into and out of an opening in the opposite side wall of base recess 36. This opposite side wall is formed in part by a semicircular recess portion 37 and by the right hand extended recess wall portions 38, as can be seen in FIG. 1C. Actuation protrusion 35 and actuation protrusion set 39 together form something of a recess between them in contact operator 12 having larger gaps in the recess side walls, as can be seen in FIG. 1B. At the opposite ends of this recess in contact operator 12 are contact operator stop protrusions, 40. These stop protrusions 40 aid in keeping cam actuator 13 positioned in base recess 36.

Figure 10:
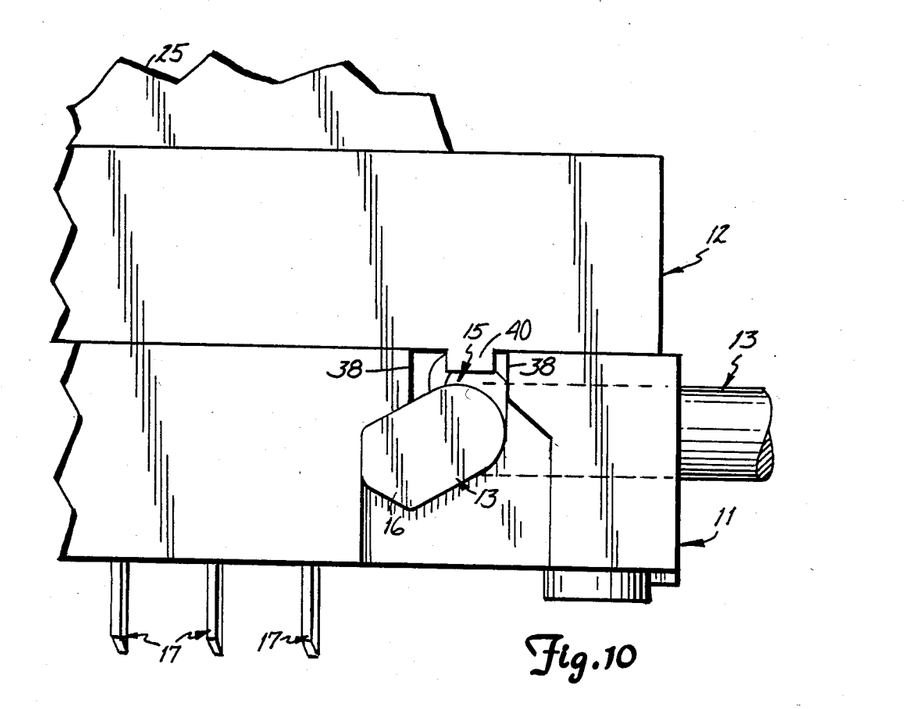
FIG. 10 shows the same connector portion as FIG. 6 but in a different state.
Figure 11:
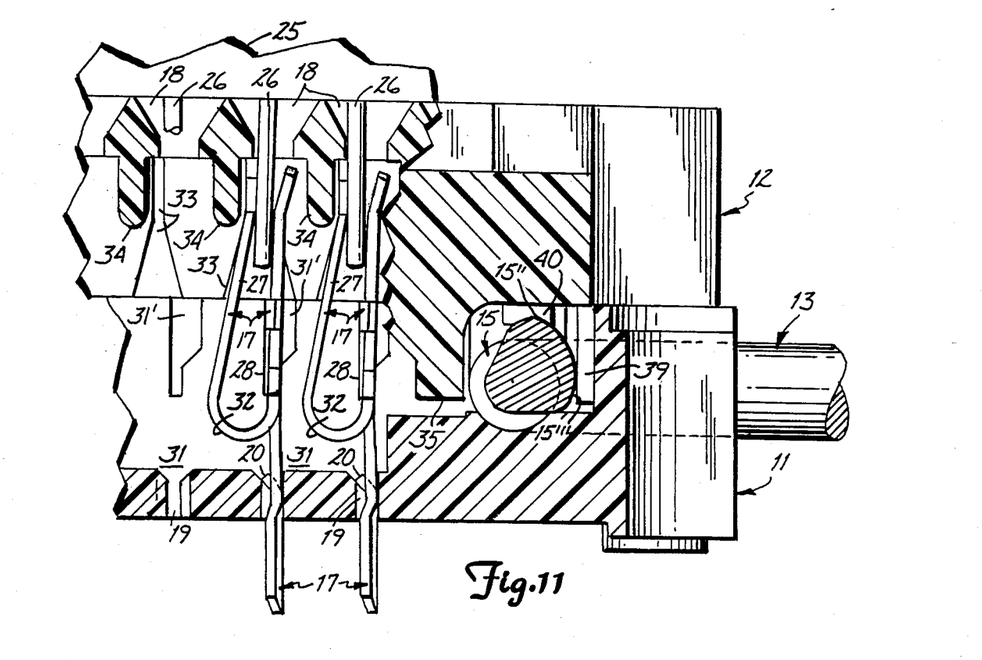
FIG. 11 shows a cross section view of the connector of FIG. 1A at the location of the cross section view in FIG. 7 but for the state shown in FIG. 10.

The results of moving cam actuator 13 to its fully clockwise position in the view of FIG. 8, with stop 16 blocked by base 11 at the opposite limit of its permitted rotational range from where it is blocked in FIG. 6, are shown in FIGS. 10 and 11. FIG. 11 is once again a cross section view of connector 10 taken in about the same place that the cross section view shown in FIG. 7 was located in connector 10 in FIG. 1A, but again with cam actuator 13 in this further position.

Cam protrusion 15''' is now pressed against actuator protrusion set 39 forcing it slightly further to the right to cause contact operator 12 to similarly move to the right. Contact operator 12 through the sides of slot 33 puts additional pressure on protrusions 29 of contact 17 to force it more strongly against terminals 26. Again, cam protrusion 15''' goes slightly past its maximum to the right extent so that the reactive force from contact 17 through contact operator 12 hold cam actuator 13 in place in this maximum terminal retaining force position.

The added increment of force on contact sides 27 provided in this position then assures good electrical contact between each of contacts 17 and its corresponding terminal 26, but without adding oppositely acting forces in too great a measure to either contact operator 12 or base 11. These oppositely reacting forces between contact operator 12 and base 11 are kept relatively low in being just an incremental amount to be added to the resilient holding force in contacts 17 holding corresponding terminals 26. As a result, connector 10 can be operated at the elevated temperatures necessary for testing device 25 without fear of creep occurring in the materials forming contact operator 12 and base 11 while maintaining good electrical contact.

Figure 12:
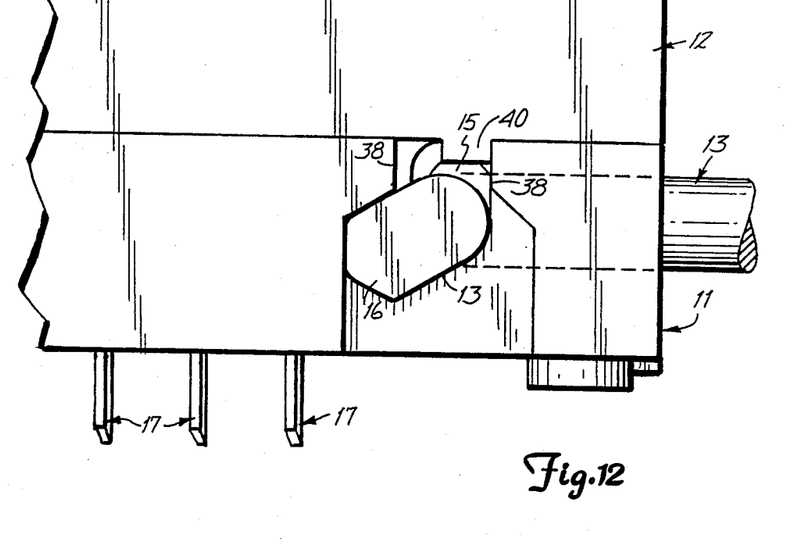
FIG. 12 shows the same connector portion as FIG. 6 in a different state.
Figure 13:
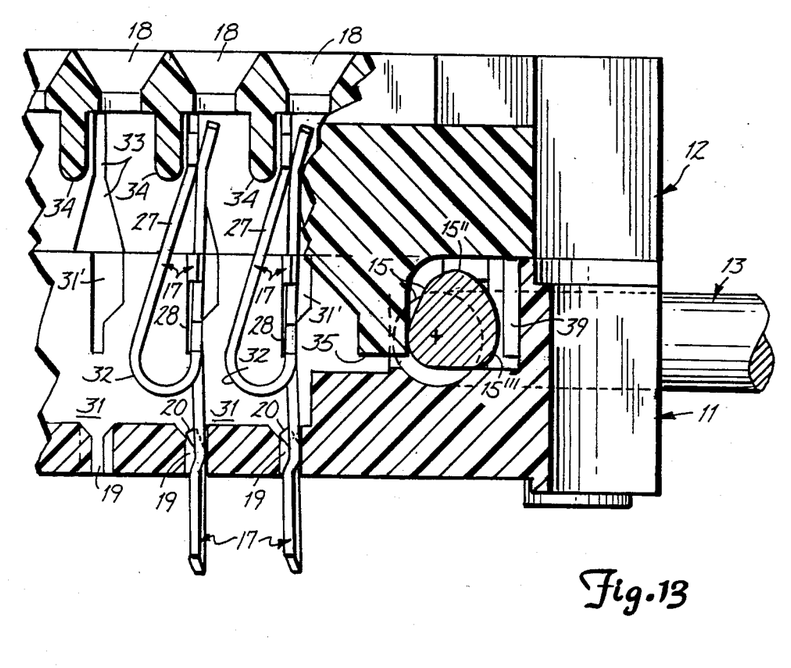
FIG. 13 shows a cross section view of the connector of FIG. 1A at the location of the cross section view in FIG. 7 but for the state shown in FIG. 12.

FIGS. 12 and 13 show similar views to those that have been shown in FIGS. 6 through 11, but without the presence of device 25 having terminals 26 inserted in connector 10. In this situation, cam actuator 13 can rotate relatively freely until cam portion 15'' comes near to engaging actuator protrusion 35. Thus, opposing sides 27 and 28 of each of contacts 17 will be against one another due to only the resilient force in each of contacts 17. The application of a sufficient counterclockwise force to cam actuator 13 will then lead to opening a space between opposing sides 27 and 28 of contact 17 permitting insertion of device terminals therebetween and returning to the condition shown in FIGS. 6 and 7.

Although the present invention has been described with reference to preferred embodiments, workers skilled in the art will recognize that changes may be made in form and detail without departing from the spirit and scope of the invention.

What is claimed is:

1. A coupling connector for electrically interconnecting electrical devices, having device electrical terminals extending therefrom, to other means containing electrical circuit portions, said coupling connector being capable of accepting said device electrical terminals being inserted in terminal reception openings thereof, and of selectively permitting application of a retaining force against said device electrical terminals thereby tending to retain same against removal and to improve conductive contact therewith, said coupling connector also being capable of selectively permitting termination of said retaining force and release of said device electrical terminals to permit same to be removed, said connector comprising:

base means having a plurality of base contact recesses opening to a base means first surface for receiving a plurality of contact means;

a plurality of contact means each having a pair of opposing contact side members which are normally biased to be adjacent to one another and which can be selectively positioned both relatively apart from one another for receiving a terminal therebetween and adjacent to one another for engaging a said terminal, each of said contact means being located in a corresponding base contact recess but extending past said base means first surface;

contact operation means adjacent said base means first surface such that said contact operation means may move with respect to said base means first surface in a plurality of directions for selectively positioning said contact means side members, said contact operation means being engaged with each of said plurality of contact means such that motion of said contact operation means in a first direction causes said opposing contact side members of each said contact means to move apart, and such that sufficient motion of said contact operation means in a second direction forces these opposing contact side members toward one another; and actuator means engaged with both said base means and said contact operation means and being capable of selectively causing said contact operation means to move in said first and second directions with respect to said base means first surface.

2. The apparatus of claim 1 wherein said contact recesses have a passageway communicating therewith and with a second surface of said base means opposite said base means first surface.

3. The apparatus of claim 2 wherein said base means has a plurality of engagement openings therein extending between said base means first and second surfaces.

4. The apparatus of claim 1 wherein said actuator means includes a rotatable shaft having a first cam protrusion extending outward radially therefrom further than at least some other portions of said rotatable shaft at those locations along said rotatable shaft where said first cam protrusion is positioned, said first cam protrusion, if rotated, being able to force said contact operation means along said base means, first surface in substantially said first direction.

5. The apparatus of claim 1 wherein a first one of said opposing contact side members in each of said plurality of contact means has a first side member impelling protrusion which extends past the second one of said opposing contact side members for engagement with said contact operation means.

6. The apparatus of claim 2 wherein each of said plurality of contact means has an external contact portion extending therefrom and through said passageway beyond said base means second surface.

7. The apparatus of claim 3 wherein each of said engagement openings has a shoulder therein, and said contact operation means has a plurality of engagement protrusions each of which projects through one of said engagement openings, each of said engagement protrusions having a lip at the end thereof which is positioned on that side of its corresponding engagement opening shoulder farthest from said base means first surface to thereby hold said contact operation means substantially against said base means first surface.

8. The apparatus of claim 4 wherein said base means has an actuator recess opening to said base means first surface, and at least a portion of said rotatable shaft is positioned therein.

9. The apparatus of claim 5 wherein said contact operation means has terminal reception openings therein and in which a corresponding one of each of said plurality of contact means extends, there being a plurality of first impelling portions in said contact operation means with one being adjacent each terminal reception opening which, if said contact operation means is moved in said first direction, can engage said first impelling protrusion and yet avoid contact with said second contact side member.

10. The apparatus of claim 6 wherein said opposing contact side members are electrically joined to one another.

11. The apparatus of claim 6 wherein said opposing contact side members are mechanically joined to one another.

12. The apparatus of claim 6 wherein at least some of said plurality of said base contact recesses open to adjacent base contact recesses.

13. The apparatus of claim 7 wherein each of said engagement openings is an extended opening which is extended in substantially said first direction so that said engagement protrusions can move therein if said contact operation means is moved in said first direction.

14. The apparatus of claim 8 wherein said actuator recess has an opening in a first side wall thereof on one side of said rotatable shaft, and said contact operation means has a first actuation protrusion which is positionable in said first side wall opening and can move away from said actuator recess if said contact operation means moves in substantially said first direction, said first cam protrusion being positionable against said first actuation protrusion for a selected first angular range of said rotatable shaft.

15. The apparatus of claim 9 wherein said contact operation means has a plurality of second impelling portions with one being adjacent each terminal reception opening which, if said contact operation means is moved in said second direction, can engage said first contact side member and yet avoid contact with said second contact side member.

16. The apparatus of claim 9 wherein said actuator means includes a rotatable shaft having a first cam protrusion extending outward radially therefrom further than at least some other portions of said rotatable shaft at those locations along said rotatable shaft where said first cam protrusion is positioned, said first cam protrusion, if rotated, being able to force said contact operation means along said base means first surface in substantially said first direction.

17. The apparatus of claim 11 wherein said opposing contact side members are electrically joined to one another.

18. The apparatus of claim 10 wherein said opposing contact side members are mechanically joined to one another.

19. The apparatus of claim 11 wherein said pair of contact side members are commonly formed from a resilient conductor and, because of said resilient conductor being resilient, are against one another absent an external force.

20. The apparatus of claim 13 wherein said engagement openings are also extended in said second direction to permit said engagement protrusions to also move substantially in said second direction if said contact operation means moves in substantially said second direction.

21. A coupling connector for electrically interconnecting electrical devices, having device electrical terminals extending therefrom, to other means containing electrical circuit portions, said coupling connector being capable of accepting said device electrical terminals being inserted in terminal reception openings thereof, and of selectively permitting application of a retaining force against said device electrical terminals thereby tending to retain same against removal and to improve conductive contact therewith, said coupling connector also being capable of selectively permitting termination of said retaining force and release of said device electrical terminals to permit same to be removed, said connector comprising:

base means having a plurality of base contact recesses opening to a base means first surface, having an actuator recess opening to said base means first surface, having a first side wall with an opening in said first side wall, and having a second side wall opposite said first side wall with an opening provided therein;

a plurality of contact means each having a pair of opposing contact side members which can be selectively positioned both relatively apart from one another and adjacent to one another, each of said contact means being located in a corresponding base contact recess but extending past said base means first surface;

contact operation means adjacent said base means first surface such that said contact operation means may move with respect to said base means first surface in a plurality of directions, said contact operation means being engaged with each of said plurality of contact means such that motion of said contact operation means in a first direction causes said opposing contact members of each said contact means to move apart, and such that sufficient motion of said contact operation means in a second direction forces these opposing contact members toward one another, said contact operation means having a first actuation protrusion which is positionable in said first side wall opening and movable with said contact operations means and away from said actuator recess when said contact operation means moves in said first direction, and a second actuation protrusion which is positionable in said second side wall opening and can move away from said actuator recess if said contact operation means moves in said second direction;

actuator means engaged with both said base means and said contact operation means and being capable of selectively causing said contact operation means to move in said first and second directions with respect to said base means first surface, said actuator means including a rotatable shaft having at least a portion positioned in said actuator recess and having a first cam protrusion extending outward radially therefrom further than at least some other portions of said rotatable shaft at those locations along said rotatable shaft where said first cam protrusion is positioned, said first cam protrusion, if rotated, being able to force said contact operation means along said base means first surface in substantially said first direction for a selected first angular range of said rotatable shaft.

22. The apparatus of claim 21 wherein said rotatable shaft has a second cam protrusion extending outward radially therefrom further than at least some other portions of said rotatable shaft at those locations along said rotatable shaft where said second cam protrusion is positioned, said second cam protrusion being positionable against said second actuation protrusion for a selected second angular range of said rotatable shaft.

23. The apparatus of claim 22 wherein said rotatable shaft has a shaft handle attached to said rotatable shaft at an angle to its axis of rotation.

24. The connector of claim 21 wherein said rotatable shaft has a radially projecting stop means for limiting the rotational range of said rotatable shaft.

25. The connector of claim 21 wherein said rotatable shaft has shaft handle means attached to said rotatable shaft for rotating said rotatable shaft.

26. The connector of claim 24 wherein said stop means extends radially from one end of said rotatable shaft and shaft handle means extends radially of said rotatable shaft from the opposite end for rotating said rotatable shaft.

27. The connector of claim 21 wherein said contact means has an external contact portion extending from said contact side members through said base means and beyond a base means second surface opposite said base means first surface.

28. A zero insertion force coupling connector for connecting a plurality of pin terminals in the connector, said connector comprising:

a base having a plurality of contact recesses arranged in rows and opening to a base first surface and having engagement openings extending between said base first surface and a base second surface;

a contact operator mating on one contact operator surface with said base first surface and having engagement protrusion means extending through said engagement openings for coupling said contact operator to said base, said contact operator also having terminal reception openings communicating with said contact recesses in said base;

a plurality of electrical contact means formed of resilient material and positioned one in each of said contact recesses and extending into a terminal reception opening, said contact means having a portion thereof of generally U-shape with the U formed of opposed sides normally urged into contact with each other for making contact to a said pin terminal, said sides of said contact means having projection means for engagement with said base and with said contact operator respectively whereby movement of said contact operator in a first direction in relationship to said base will move said contact sides apart and movement in a second direction will force said sides toward one another; and rotatable cam means engagable with said base and said contact operator for moving said contact operator in said first direction for allowing insertion of pin terminals between said sides of said contact means and for movement of said contact operator in said second direction to first allow said sides to resiliently close on said pin terminals and then to further move said contact operator in said second direction to cam said sides of said contact means tightly against said pin terminals.

29. A connector according to claim 28 wherein said rotatable cam means comprises a shaft fitting through a recess formed between said base and said contact operator and cam protrusions engagable with portions of said contact operator to move the same upon rotation of said shaft.

30. A connector according to claim 29 wherein said shaft has a handle adjacent one end for rotating said shaft and stop means for limiting said rotation in each direction of rotation to retain said handle in two predetermined positions.

* * * * *